United States Patent [19]

Lowy

[11] Patent Number: 5,574,673
[45] Date of Patent: Nov. 12, 1996

[54] PARALLEL ARCHITECTURE FOR GENERATING PSEUDO-RANDOM SEQUENCES

[75] Inventor: Menahem Lowy, Arlington, Tex.

[73] Assignee: Board Of Regents, The University Of Texas System, Austin, Tex.

[21] Appl. No.: 346,159

[22] Filed: Nov. 29, 1994

Related U.S. Application Data

[63] Continuation-in-part of Ser. No. 158,969, Nov. 29, 1993, abandoned.

[51] Int. Cl.$^6$ ........................................ G06F 1/02
[52] U.S. Cl. ........................................ 364/717
[58] Field of Search .................. 364/717, 717.5, 364/715.08; 380/46; 331/78

[56]  References Cited

U.S. PATENT DOCUMENTS

| | | | |
|---|---|---|---|
| 3,614,400 | 10/1971 | Farnett et al. | 235/152 |
| 3,777,278 | 12/1973 | Majeau et al. | 364/717 |
| 4,133,974 | 1/1979 | Morgan | 178/22 |
| 4,241,447 | 12/1980 | Epstein | 375/1 |
| 4,583,225 | 4/1986 | Yamada et al. | 371/37 |
| 5,022,079 | 6/1991 | Lockhart, Jr. | 380/14 |
| 5,031,129 | 7/1991 | Powell et al. | 364/717 |
| 5,144,669 | 9/1992 | Faulkner et al. | 380/49 |
| 5,268,949 | 12/1993 | Watanabe et al. | 364/717 |
| 5,312,641 | 6/1994 | Ohkubo | 364/717 |
| 5,331,581 | 7/1994 | Ohkubo et al. | 364/717 |

OTHER PUBLICATIONS

Chandrakasan, A. P.; Sheng, S.; and Brodersen, R. W., "Low-Power CMOS Digital Design", IEEE Journal of Solid–State Circuits, vol. 27, No. 4, pp. 473–484, Apr. 1992.
Friedman, A. D.; and Menon, P. R., *Theory & Design Of Switching Circuits*, pp. 335–336, 1975.
Lin, S.; and Costell, D. J., Jr., *Error Control Coding: Fundamental and Applications*, pp. 108–109, 1983.
Liu, D.; and Svennsson, C., "Trading Speed for Low Power by Choice of Supply and Threshold Voltages", IEEE Journal of Solid–State Circuits, vol. 28, No. 1, pp. 10–17, Jan. 1993.

*Primary Examiner*—Roy N. Envall, Jr.
*Assistant Examiner*—Chuong D. Ngu
*Attorney, Agent, or Firm*—Arnold, Whiteh & Durkee

[57]  ABSTRACT

A parallel architecture for implementing a digital sequence generator is provided, which contains taps connected to selected fixed memory cells and the taps of the logic circuitry are switched among the cells. The architecture disclosed and claimed herein generates an identical sequence while consuming substantially less power than a linear feedback shift register implementation. The parallel architecture may also be used to implement a parallel shift register in other applications.

11 Claims, 11 Drawing Sheets

| CELL \ CYCLE | 0 | 1 | 2 | 3 | 4 | 5 | 6 | 7 | 8 | 9 |
|---|---|---|---|---|---|---|---|---|---|---|
| 1X | 1 | 0 | 0 | 1 | 1 | 0 | 1 | 0 | 0 | 1 |
| 2T | 1 | 1 | 0 | 0 | 1 | 1 | 0 | 1 | 0 | 0 |
| 3 | 1 | 1 | 1 | 0 | 0 | 1 | 1 | 0 | 1 | 0 |
| 4 | 1 | 1 | 1 | 1 | 0 | 0 | 1 | 1 | 0 | 1 |
| 5T | 1 | 1 | 1 | 1 | 1 | 0 | 0 | 1 | 1 | 0 |
| OUTPUT | 0 | 0 | 1 | 1 | 0 | 1 | 0 | 0 | 1 | 0 |

FIG. 10A
(Prior Art)

| CELL \ CYCLE | 0 | 1 | 2 | 3 | 4 | 5 | 6 | 7 | 8 | 9 |
|---|---|---|---|---|---|---|---|---|---|---|
| 1 | 1 | 1T | 1 | 1 | 1T | 0X | 0T | 0 | 0 | 0T |
| 2 | 1T | 1 | 1 | 1T | 1X | 1T | 1 | 1 | 1T | 1X |
| 3 | 1 | 1 | 1T | 1X | 1T | 1 | 1 | 1T | 0X | 0T |
| 4 | 1 | 1T | 0X | 0T | 0 | 0 | 0T | 0X | 0T | 0 |
| 5 | 1T | 0X | 0T | 0 | 0 | 0T | 1X | 1T | 1 | 1 |
| OUTPUT | 0 | 0 | 1 | 1 | 0 | 1 | 0 | 0 | 1 | 0 |

FIG. 10B

| CYCLE\CELL | 0 | 1 | 2 | 3 | 4 | 5 | 6 | 7 | 8 | 9 | 10 | 11 | 12 |
|---|---|---|---|---|---|---|---|---|---|---|---|---|---|
| 1 | 1 | 0 | 0 | 0 | 0 | 1 | 0 | 1 | 0 | 1 | 1 | 0 | 0 |
| 2 | 1 | 1 | 0 | 0 | 0 | 0 | 1 | 0 | 1 | 0 | 1 | 1 | 0 |
| 3 | 1 | 1 | 1 | 0 | 0 | 0 | 0 | 1 | 0 | 1 | 0 | 1 | 1 |
| 4T | 1 | 1 | 1 | 1 | 0 | 0 | 0 | 0 | 1 | 0 | 1 | 0 | 1 |
| 5T | 1 | 1 | 1 | 1 | 1 | 0 | 0 | 0 | 0 | 1 | 0 | 1 | 0 |
| 6T | 1 | 1 | 1 | 1 | 1 | 1 | 0 | 0 | 0 | 0 | 1 | 0 | 1 |
| 7T | 1 | 1 | 1 | 1 | 1 | 1 | 1 | 0 | 0 | 0 | 0 | 1 | 0 |
| OUTPUT | 0 | 0 | 0 | 0 | 1 | 0 | 1 | 0 | 1 | 1 | 0 | 0 | 0 |

FIG. 11A
(Prior Art)

| CYCLE\CELL | 0 | 1 | 2 | 3 | 4 | 5 | 6 | 7 | 8 | 9 | 10 | 11 | 12 |
|---|---|---|---|---|---|---|---|---|---|---|---|---|---|
| 1 | 1 | 1 | 1 | 1T | 1T | 1T | 1T | 1X | 1 | 1 | 1T | 1T | 1T |
| 2 | 1 | 1 | 1T | 1T | 1T | 1T | 0X | 0 | 0 | 0T | 0T | 0T | 0T |
| 3 | 1 | 1T | 1T | 1T | 1T | 1X | 1 | 1 | 1T | 1T | 1T | 1T | 0X |
| 4 | 1T | 1T | 1T | 1T | 0X | 0 | 0 | 0T | 0T | 0T | 0T | 0X | 0 |
| 5 | 1T | 1T | 1T | 0X | 0 | 0 | 0T | 0T | 0T | 0T | 1X | 1 | 1 |
| 6 | 1T | 1T | 0X | 0 | 0 | 0T | 0T | 0T | 0T | 1X | 1 | 1 | 1T |
| 7 | 1T | 0X | 0 | 0 | 0T | 0T | 0T | 0T | 0X | 0 | 0 | 0T | 0T |
| OUTPUT | 0 | 0 | 0 | 0 | 1 | 0 | 1 | 0 | 1 | 1 | 0 | 0 | 0 |

FIG. 11B

PARALLEL ARCHITECTURE FOR GENERATING PSEUDO-RANDOM SEQUENCES

The Government may have certain rights in this invention, which was supported in part under Contract No. N66001-92-D-0092 (U.S. Navy).

This application is a continuation-in-part of U.S. patent application Ser. No. 08/158,969, filed Nov. 29, 1993, now abandoned.

BACKGROUND OF THE INVENTION

1. Field of the Invention

This invention relates to computer science and communications engineering. More particularly, relates to an apparatus and method for generating sequences, such as Gold sequences, using a novel parallel architecture.

2. Description of the Prior Art

Modern integrated circuit products can contain several million transistors while dissipating power on the order of 20 watts. This high level of power dissipation prevents use of these circuits in applications with limited power Supply capacity, such as notebook computers, cellular phones and other portable computing and communication products. There is therefore a continuous need to further reduce the power consumption of integrated circuits, especially in systems operating at very fast clock frequencies. In portable computers, conventional nickel-cadmium batteries only provide 20 watt-hours of energy per pound. Improvements in battery technology are underway, but it is unlikely that spectacular increases in the energy-to-weight ratio will be realized in the very near future.

Even in non-portable applications, where up until now power could be dissipated by heat sinks and cooling fans, the density and size of chips and systems continues to increase, resulting in increased cooling requirements. Such increased power and cooling requirements cause difficulty in providing adequate cooling, that might add significant cost to systems, or that may limit the amount of functionality that can be provided.

It is evident that methods for decreasing the amount of power used by a circuit providing a given functionality are desirable for conserving battery power, for reducing cooling requirements, and for allowing increased functionality in state-of-the-art systems. Improvements are being made in circuit design and fabrication methods to reduce power requirements. Improved algorithms can also be developed to provide desired functionality with lower power requirements.

Digital codes and sequence generators are used extensively in communications, radar, navigation and computer disciplines. The types of systems in which they play a key role continue to increase due to advances in technology which favor the use of digital signal processing. Many of these applications must provide high computation rates but cannot incur the power consumption penalty associated with high clock frequencies. As digital coding techniques implemented by sequence generators are used in many of these applications, there is a need to increase the speed while reducing the power dissipation of such sequence generators.

A main use of digital sequences and codes is in the implementation of codes for information transmission and for error control and error detection. See, e.g., S. W. Golomb, *Shift Register Sequences,* Holden-Day, Inc., 1967; J. G. Proakis, *Digital Communications,* McGraw-Hill Book Co., 1989; W. W. Peterson and E. J. Weldon, Jr., *Error Correcting Codes,* The MIT Press, 1972; and J. E. Hershey and R. K. R. Yarlagadda, *Data Transportation and Protection,* Plenum Press, 1986. In particular, code or sequence generators are used in applications such as spread-spectrum communication systems, digital telephony systems, global positioning systems, and implementation of codes used for encryption and error correction systems.

The basic architectures of linear feedback shift registers are also used in many other applications, such as for generating a pseudo-random sequence or for the division of a train of pulses.

Up to the present, the conventional implementation of such sequence generators has been based on linear-feedback shift registers, wherein the registers are typically flip-flops. An example of such an implementation is shown in FIG. 1. See also U.S. Pat. No. 3,614,400, "Maximum Length Pulse Sequence Generators", which is incorporated herein by reference.

FIG. 1 shows the conventional architecture for using a linear feedback shift register to generate a digital sequence based on the polynomial $x^7+x^6+x^5+x^4+1$. This polynomial is selected as a representative formula which might be used. The length N of the shift register is determined by the highest degree of the polynomial, in this case seven. The locations of the taps 112 connected to shift register cells 110 correspond to the exponents that appear in the polynomial. Thus, in the illustrated case, there are four taps 112 connected to shift register cells 110, which are numbered "7", "6," "5" and "4". The values of the bits at these taps are added modulo two (exclusive OR operation) in logic circuitry 116, and the final resulting bit is fed back to the input, or shift register cell number "1", of the shift register through output line 114. At each clock pulse a new bit will be generated by the logic tree and presented at the input of the shift register cell number "1", while the bit in each shift register cell, which may be a flip-flop or other bi-stable memory device, is transmitted to the shift register cell on the right. The output sequence generated by such a shift register is typically taken from the feedback connection (the output of the logic tree), and is dependent upon the initial states of the N shift register cells, as bits past the taps, as in a conventional shift register implementation, in the present invention the taps are connected to the appropriate memory cells by a set of switches that selectively connect the taps to the proper memory cells in each cycle. Furthermore, in some embodiments, the present invention provides more than one member of the output sequence in each clock cycle, thus allowing sequence code to be supplied to other circuits at rates several times faster than the internal speed of the sequence generator itself.

A "tap exchange" method is provided that minimizes the number of switches necessary to implement a desired sequence generator, and that reduces the number of connections between the memory cells and the combinatorial logic, which may be an "exclusive-or" (XOR) tree. For a sequence generator having N registers or memory cells and M taps into the feedback logic, the number of switches can be reduced to the order of N+M.

In one embodiment, the present invention is a digital sequence generator, comprising a plurality of memory cells, each memory cell storing a bit of information in a digital format; logic circuitry having a plurality of inputs connectable to selected memory cells by tap switches, for generating an output based upon the contents of said memory cells; each of said tap switches for selectively connecting one of said memory cells to an input of said logic circuitry; and feedback circuitry for coupling the output of the logic circuitry to an input of a selected memory cell.

This invention, in a second embodiment, is a method of generating digital sequences, comprising providing a plurality of memory cells, logic circuitry for generating an output based upon contents of selected memory cells, Gap switches operable to connect selected memory cells to inputs of the logic circuitry, and feedback circuitry; closing selected tap switches to connect selected memory cells to input of the logic circuitry; calculating an output using said logic circuitry, said output being dependent upon the contents of the memory cells connected to said inputs of the logic circuitry, said output becoming one bit in the digital sequence being generated; and storing said output in a selected one of said memory cells using said feedback circuitry.

This invention, in a third embodiment is a digital sequence generator for generating two or more bits of a digital sequence simultaneously, comprising a plurality of memory cells, each memory cell storing a bit of information in a digital format; two or more logic circuitries, each logic circuitry having a plurality of inputs connectable to selected memory cells, each logic circuitry for generating an output based on the information stored in said memory cells; two or more tap switches, each tap switch for selectively connecting one of said memory cells to an input of a selected input of said logic circuitries; and feedback circuitry for selectively coupling the output of the logic circuitry to an input of a selected one of said memory cells.

This invention, in a fourth embodiment, is a parallel shift register, comprising: a plurality of digital storage cells, each digital storage cell adapted for storing a bit of information in digital format; input logic circuitry having a plurality of input lines connectable to selected digital storage cells by tap switches; output logic circuitry having one or more output lines connectable to selected memory cells by output switches; each of said tap switches for selectively connecting one of said digital storage cells to a selected first input of said first logic circuitry.

In a fifth embodiment, the invention is a parallel shift register employing a parallel architecture, comprising: a plurality of cells, each cell for storing a bit of digital information; input switches coupled to each of said cells for selectively providing digital information from an input line for storage in each of said well as the polynomial implemented in the logic tree. While this type of architecture is adequate to generate the desired sequence in a straightforward way and with minimal hardware, it suffers from two major drawbacks: First, the complete structure must be switched or shifted in each clock cycle, thus dissipating a significant amount of power when clocked at a high rate or when using long shift registers, and second, only one bit of the output sequence is generated per clock cycle.

It is desirable, given the recent proliferation of battery powered computing and communication devices and the increasing clock speeds at which they operate, to provide an apparatus that can generate the same or similar sequences to those generated by the above-described shift register devices while utilizing less electrical energy. It is also desirable to generate such sequences several bits at a time (in parallel) so that the sequence bits may be generated at a rate faster than the internal clock rate of the sequence generator.

SUMMARY OF THE INVENTION

The deficiencies in the prior art are addressed in part by this invention, which provides a pseudo-random sequence generator that requires substantially less power than prior known sequence generators. As noted above, prior pseudo-random sequence generators are typically implemented as shift registers combined with appropriate combinatorial logic. In such devices, relatively large amounts of power are required to shift each bit to the adjoining register in each cycle. For an N-cell register, the contents of all N-cells are moved during each cycle, and taps are connected to certain shift register cells in the shift register to connect selected shift register cells to the combinatorial logic.

In contrast, this invention provides a pseudo-random sequence generator that is implemented, for example, in a set of independent memory cells rather than a shift register. Instead of shifting the cells; output switches coupled to each of said cells for selectively connecting each of said cells to an output line; and control circuitry for controlling the operation of the input switches and the output switches.

These and other advantages of the present invention will be further appreciated from the drawings and from the detailed description provided below.

BRIEF DESCRIPTION OF THE DRAWINGS

So that the manner in which the herein described advantages and features of the present invention, as well as others which will become apparent, are attained and can be understood in detail, more particular description of the invention summarized above may be had by reference to the embodiment thereof which is illustrated in the appended drawings, which drawings form a part of this specification.

It is to be noted, however, that the appended drawings illustrate only exemplary embodiments of the invention and are therefore not the considered limiting of its scope, for the invention may admit to other equally effective embodiments.

FIG. 10A is a chart showing the generation of a sequence based on $x^5+x^2+1$ using a conventional shift register sequence generator, as shown in FIG. 2.

FIG. 10B is a chart showing the generation of the same sequence as in FIG. 10A with a sequence generator according to the present invention.

FIG. 11A is a chart showing the generation of a sequence with a seven memory cell apparatus, based on the polynomial $x^7+x^6+x^5+x^4+1$, using a conventional shift register sequence generator with stationary taps, as shown in FIG. 1.

FIG. 11B is a chart showing the generation of the same sequence as in FIG. 11A with a sequence generator according to the present invention, as shown in FIG. 4A and FIG. 5.

DETAILED DESCRIPTION OF PREFERRED EMBODIMENTS

The present invention provides a parallel architecture for a code generator that employs an array of independent memory cells combined with a logic tree instead of shift register, and a method for reducing the number of connections between the memory cells and the logic tree. The basic configuration of an exemplary embodiment of this invention is shown in FIG. 3.

Figure 3:
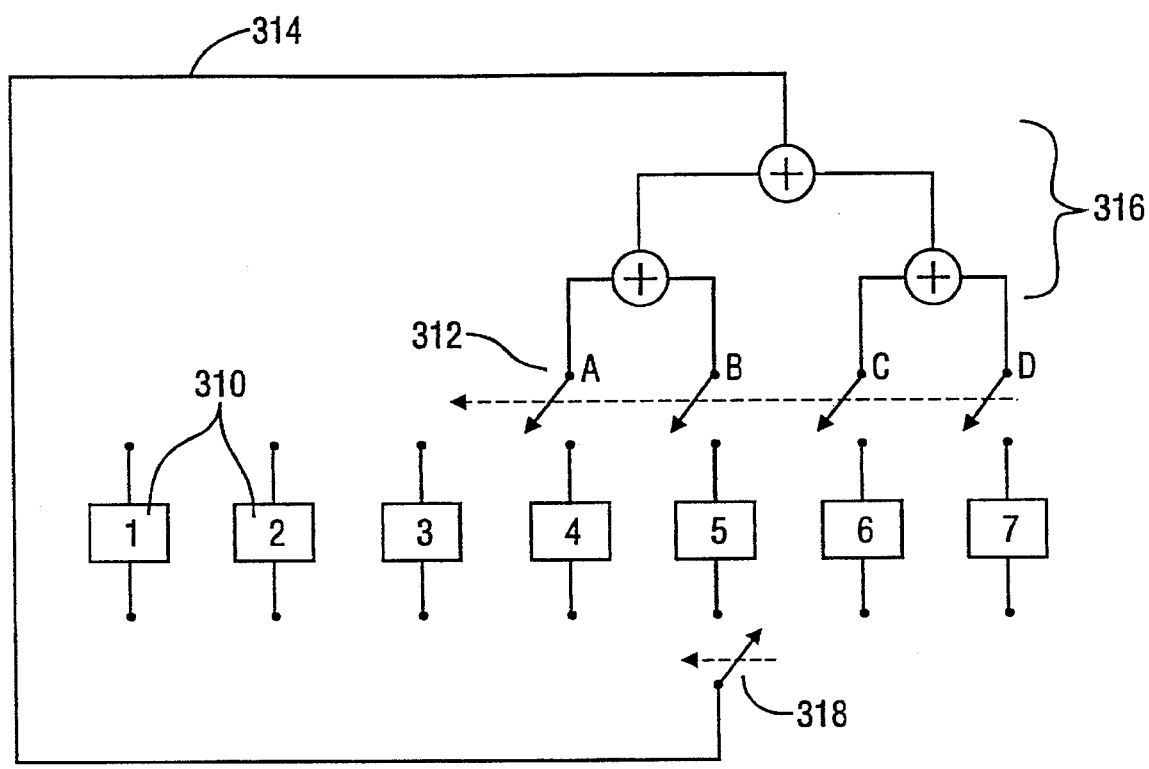
FIG. 3 is a block diagram of a simple embodiment of a sequence generator in accordance with the parallel architecture of this invention to implement the polynomial $x^7+x^6+x^5+x^4+1$.

The embodiment in FIG. 3 exemplifies an array or register of independent memory cells 310 for generating a digital sequence for a polynomial whose terms involve a single variable having different exponents. The terms are typically ordered beginning with the variable term having the highest exponent. The polynomial implemented by the embodiment shown in FIG. 3 is "$X^7+X^6+X^5+X^4+1$". The highest exponent in that polynomial is "7".

In a preferred embodiment, the memory cells 310 are equal in number to the highest exponent in the polynomial, and they are typically numbered from one to the highest exponent. The memory cells 310 are independent of one another and are arranged to be selectively connected to logic circuitry 316 by input selector switch 318 and a set of four taps 312 labeled A, B, C, and D. The taps 312 are equal in number to the number of variable terms in the polynomial. The taps 312 constitute the inputs to an XOR decision tree 316. The output of the XOR tree 316 is fed back to input selector switch 318 via output and feedback line 314. Input selector switch 318 forms part of the feedback circuitry.

This structure may be used in circuitry that includes means for generating a clock signal. Each successive clock signal causes each tap 312, plus the input selector switch 318, to step along the array of memory cells 310 by one memory cell, as is described in more detail below. The number of switches can be reduced according to the switch minimization method detailed below.

The array of memory cells 310 may be termed a cyclic array in that the individual taps 312 and input selector switch 318 move along the memory cells one-by-one to one end of the array and then cycle back to the memory cell at the other end. Rather than shifting the contents of the memory cells through a shift register past stationary taps (as in FIG. 1 and FIG. 2), in this invention the taps 312 are selectively connected to different memory cells 310 during each clock cycle, and the memory cell contents are static unless changed using feedback line 314 and input selector switch 318. In preferred embodiments, the taps 312 and feedback selector switch 318 are "moved" from one memory cell 310 to another by manipulation of switches that connect the memory cells 310 to the logic circuitry 316.

The logic circuitry, memory cells, switches, and other elements of the architecture described herein may be implemented in any of a multitude of techniques that are known in the art. The choice of implementation techniques is a matter of design choice that will depend upon the particular application for which the invention is intended.

Figure 1:
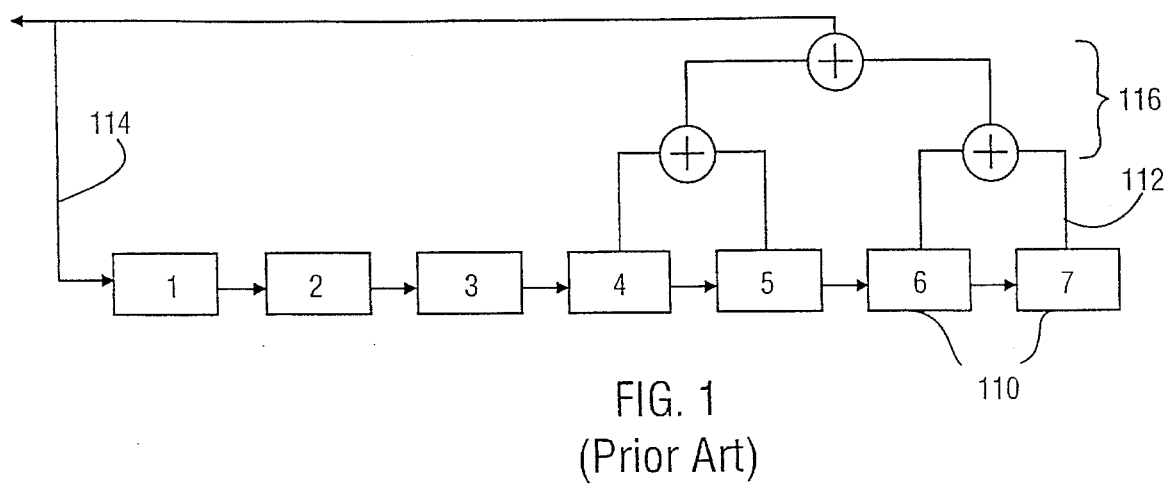
FIG. 1 is a block diagram of a prior art sequence generator using a linear feedback shift register to implement the polynomial $x^7+x^6+x^5+x^4+1$.
Figure 4A:
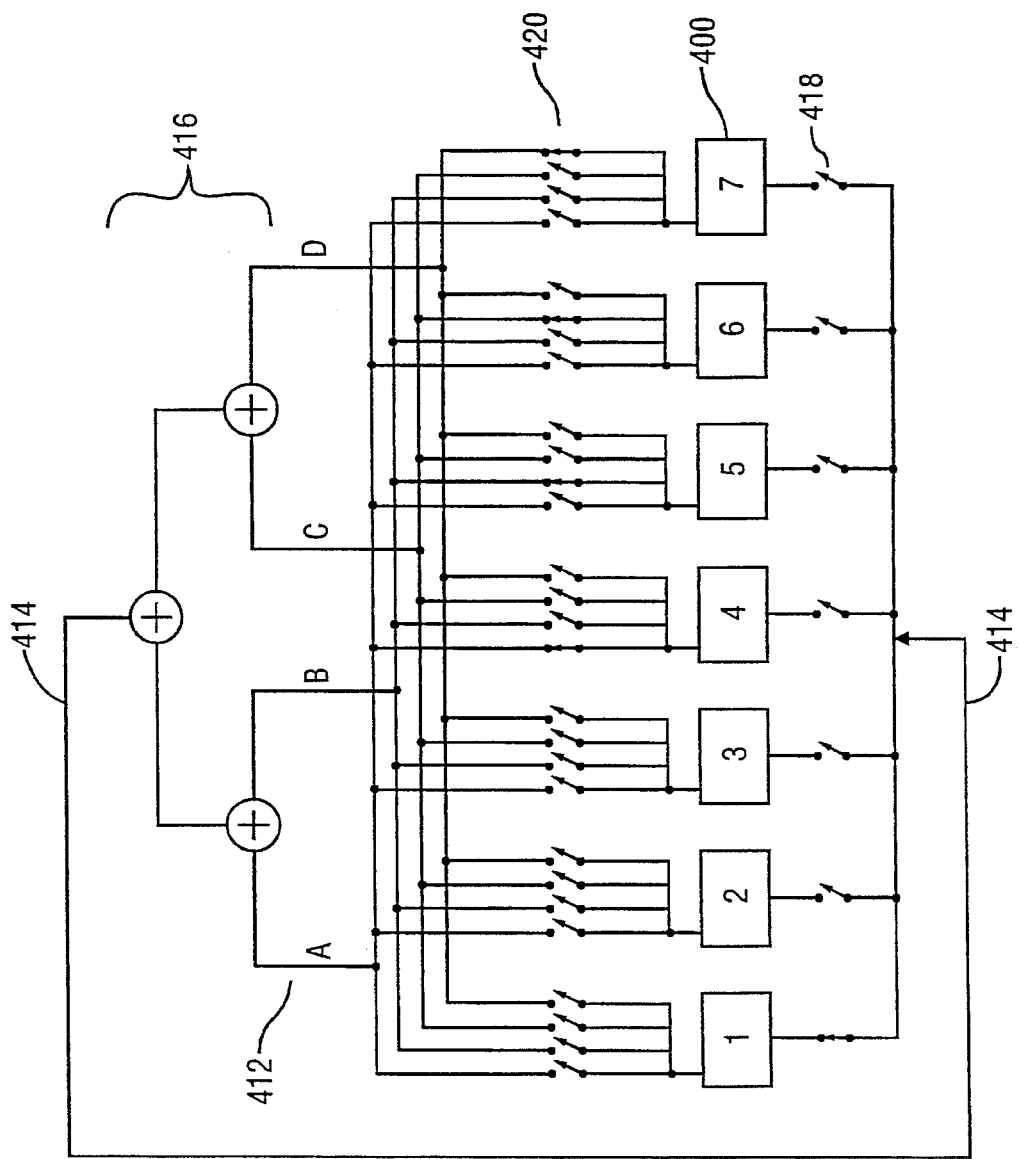
FIG. 4A is a block diagram of the parallel architecture of this invention prior to minimization of the number of switches used and FIG. 4 is a phase generator and a control unit.

A non-optimized parallel architecture is shown in FIG. 4A that implements the polynomial of degree 7 shown in the prior art implementation of FIG. 1. In the initial clock cycle illustrated in FIG. 4A, the four taps 412 into the logic tree are connected by tap selection switches 420 to memory cells numbered "4", "5", "6", and "7", and the feedback line 414 is connected by input selector switches 418 to memory cell 400 numbered "1." Referring to FIG. 4A, instead of the bits moving from memory cell to memory cell at each clock cycle, as in a shift register, the four taps 412 providing input to the XOR tree 416 are switched from memory cell to memory cell as dictated by a control unit 430. The implementation of a control unit will be described below in connection with FIG. 6. At each clock cycle the tap connections move in the direction of the preceding memory cell (to the left in the figure) by operation of tap selector switches 420. Referring to the exemplary embodiment illustrated in FIG. 4A, the tap which was originally connected to memory cell 410 number "6" for instance (tap C), moves to memory cell 400 number "5" in the next clock cycle, the tap originally connected to memory cell 400 number "5" (tap B) moves to memory cell 400 number "4" and so on. A tap 412 connected to memory cell 400 number "1" (the first cell) would move to memory cell 400 number "7" (the last cell) in the subsequent cycle. This operation is mathematically equivalent to the conventional architecture in which the taps are permanently connected to particular cells, and the bits move to the next higher cell at each clock cycle. According to the present invention, the taps 412 may be moved by operation of tap selector switches 420 located between the memory cells 400 and the XOR tree 416, as is illustrated in FIG. 4A in a non-optimized embodiment.

In the embodiment illustrated in FIG. 4A and FIG. 45, control unit 430 operates in response to N-phase generator unit 440 to control the array of tap selector switches 420 and input selector switches 418. Generator unit 440 may be implemented by any of numerous techniques known in the art to generate a repeating series of pulses on each of n control lines, where n is the number of the highest exponent in the polynomial being implemented. At the beginning of any given operation, depending upon the polynomial being implemented and the desired initial conditions, the memory cells 400 are placed in preselected states. Similarly, the tap selector switches 420 and input selector switches 418 are placed in a preselected initial configuration. Thus, for example, each of the memory cells 400 may be placed in the same binary state of one, the taps 412 may be initially connected by means of switches 420 to the memory cells 400 corresponding in number to the exponents of the terms in the polynomial, and the input selector switch 418 may be connected to the last memory cell (e.g., cell number "1" in FIG. 3 or FIG. 4A). The operation of such a sequence generator is described by way of example below, in conjunction with FIG. 11A and FIG. 11B.

As explained later in this description, preferred embodiments of the invention may be optimized to greatly reduce the number of switches and switching operations that may appear to be required by the system of the invention.

In preferred embodiments, at each clock cycle the control unit 430 updates one selected cell with a feedback value obtained from the logic tree 416. Thus, during each clock cycle only one memory cell of the array may undergo a transition while all the other memory cells remain static and do not dissipate switching power.

Figure 4B:
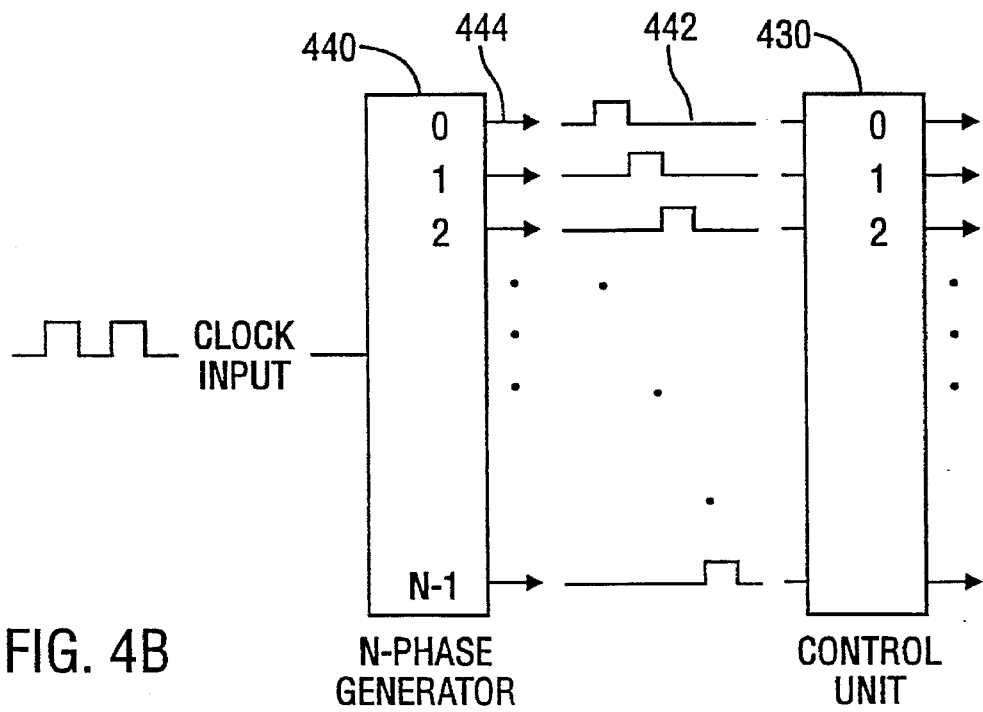

FIG. 4B includes block diagram representations of preferred control circuitry that could be used to implement this invention. The N-phase generator clock circuit 440 (N=the number of memory cells 400, seven memory cells are illustrated) generates successively N square pulse waveforms 442 on its N outputs 444. Each waveform 442 consists of a single pulse having a width of one time period. In response to each waveform 442 from the N-phase generator 440, the control unit 430 generates signals to close the appropriate tap switches 420 and input switches 418 such that the taps 412 and feedback line 414 are connected to the desired memory cells 400 during each time period. The XOR tree 416 computes the resulting output/feedback bit, which is directed by the control unit 430 and input switch 418 and stored in the selected memory cell 400. Although this architecture may require more hardware than the conventional shift register-based architecture, less circuitry is switched during each clock cycle, thus reducing the power dissipation of the system.

The sequence generation architecture according to this invention may be implemented with a large number of tap selector switches 420, as shown in FIG. 4A, wherein each tap 412 of the XOR tree 416 is connectable to the entire array of memory cells 400 and therefore needs to be connected by a switch to each memory cell in the array. Such an implementation having N memory cells and M taps could be constructed using N×M tap selector switches 420 on the input side of the logic circuitry 416, which, even for small N and M can require a large number of switches. It is possible, however, to reduce the number of switches significantly. The minimization procedure described below reduces the number of switches to the order of N+M. For example, a 13 memory cell implementation with 8 taps (N=13, M=8) may be implemented with 104 (13×8) tap selector switches so that each tap is connectable to each memory cell. Alternatively, in the practice of this invention implementation of the same polynomial may be constructed with as few as 24 tap selector switches. For larger N and M values the switch count reduction is even greater. The physical implementation of each switch may require only one transistor, permitting a complex sequence to be generated with minimal hardware and minimal power consumption.

Figure 2:
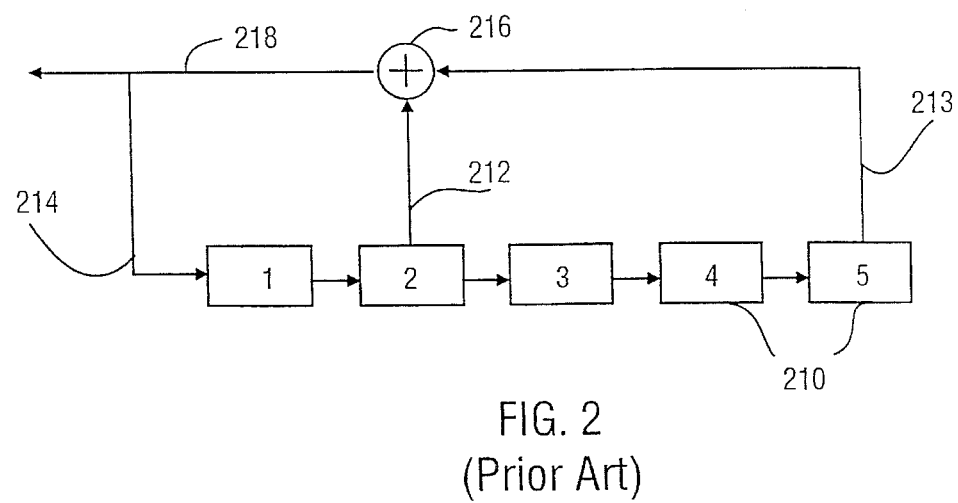
FIG. 2 is a block diagram of a prior art sequence generator using a linear feedback shift register to implement the polynomial $x^5+x^2+1$.

To illustrate how the present invention operates as compared to a conventional linear feedback shift register, consider FIG. 2, which shows a conventional five memory cell shift register implementation of a sequence generator whose operation is illustrated in the chart of FIG. 10A. This sequence generator implements the polynomial $x^5+x^2+1$. Referring to FIG. 2, taps 212, 213 are connected to shift register cells 210 numbered "2" and "5" of the shift register, the contents of shift register cells numbered "2" and "5" are added modulo 2 (as by XOR gate 216), and the result, which comprises one bit of the sequence being generated, is presented at output 218 and fed back into the shift register cell 210 numbered "1" by feedback line 214 while the contents of all of the shift register cells 210 are shifted one cell to the right. As can be seen in FIG. 10A, when the initial contents of the shift register cells are all 1's, the code sequence beginning with 0011010010 is generated on output line 218.

Figure 8:
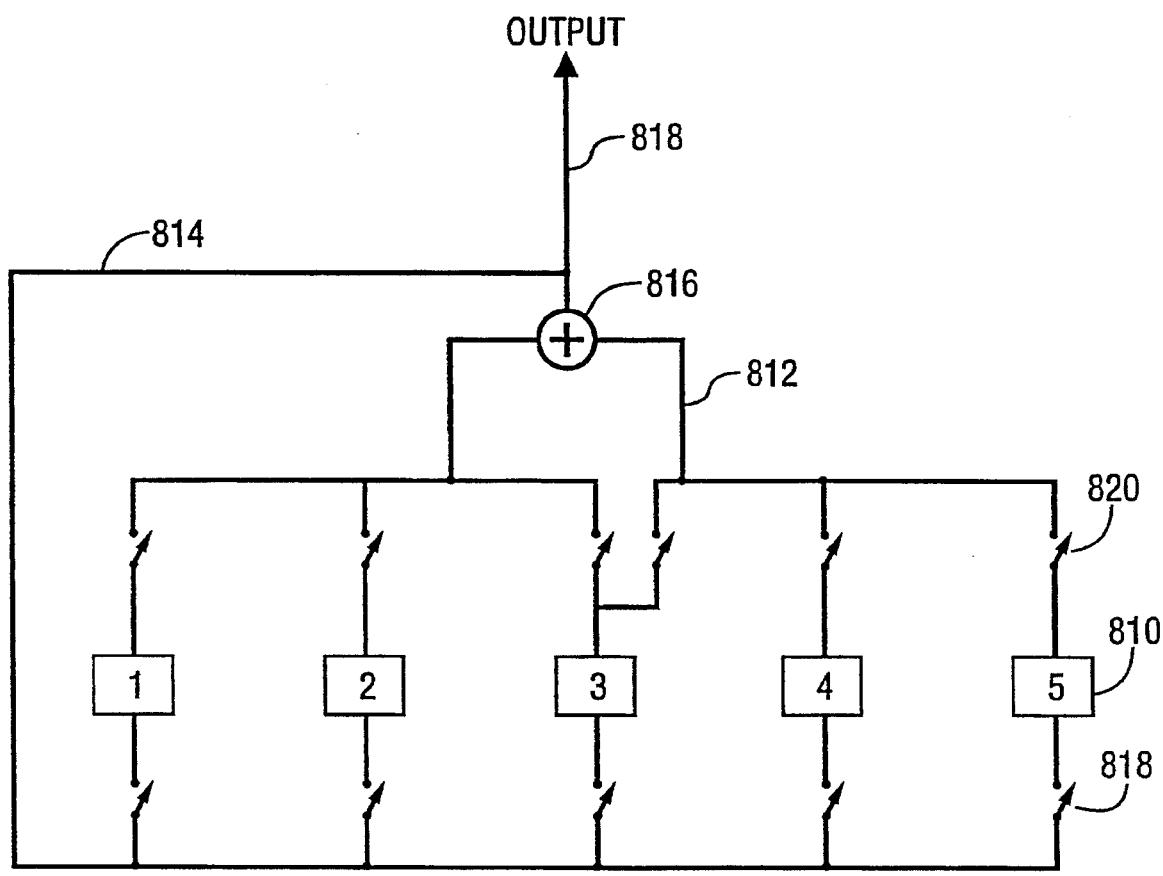
FIG. 8 is a block diagram of a five memory cell, two-tap implementation of this invention to produce sequences based on the polynomial $x^5+x^2+1$.

An embodiment of a sequence generator implemented according to the present invention, that generates the same sequence as described in the preceding paragraph for FIG. 2, is shown in FIG. 8. Rather than being configured as a shift register, each of the five memory cells 810 is an independent memory cell, which may, for example, be implemented as a flip-flop, or another type of memory or storage element as are well known in the art. Rather than shifting the contents of each memory cell to the neighboring memory cell in each cycle while keeping the taps 812 connected to the same memory cells 810 (as in the prior art), the illustrated implementation uses tap selector switches 820 to connect the taps 812 to the desired memory cells 810 during each cycle. The only memory cell that changes state in a cycle is the memory cell that the feedback line 814 is connected to by operation of input selector switches 818. FIG. 10B shows the states of the memory cells of FIG. 8 over the course of a number of clock cycles. The memory cells or "stages" that the taps are connected to during each clock cycle are indicated by the letter "T" in the chart of FIG. 10B, and the stage that receives the output from the prior cycle is indicated by an "X" in the chart. Beginning with a 1 in every memory cell, the taps are initially coupled to memory cells 810 numbered "2" and "5" during cycle 0, yielding an output of zero (1 XOR 1=0). Feedback line 14 in this cycle is connected to memory cell "1". At the following clock signal (separating cycle 0 from cycle 1), the output result from XOR gate 816 is latched into memory cell 810 number "5", and importantly, the remainder of the stages retain their prior values. To continue, in cycle 2 the taps 812 are connected to memory cells 810 numbered "1" and "4" by tap selector switches 820, generating a logic zero that is directed to the memory cell 810 number "4", and so on, as is illustrated in the chart of FIG. 10B. Substantial power savings can be realized by not having to shift each of N stages in an N-stage shift register on each clock signal, particularly at very high clock rates. Comparison of FIG. 10A and FIG. 10B reveals that the same output sequence is generated by the prior art sequence generation architecture shown in FIG. 2 and by the improved sequence generator of this invention shown in FIG. 8.

Note in the embodiment of FIG. 8 that it is not necessary to couple every memory cell 810 to both input switches 812 of XOR gate 816. All necessary connections to implement the polynomial $x^5+x^2+1$ can be implemented with six tap switches 820 and five input switches 818.

An optimization method for minimizing the number of switches required to implement a sequence generator according to the present invention will now be described. Referring to FIG. 4A, the number of switches 420 connecting the memory cells 410 to the taps 412 of the XOR tree 416 can be reduced by recognizing that during each clock cycle the XOR operations can be performed in any order without altering the final result. Thus the result of A XOR B XOR C XOR D is identical to the result of B XOR D XOR A XOR C (or any other permutation). This feature is due to the commutative property of the modulo 2 addition over the field of binary numbers. By rearranging the order of the taps or by reassigning the taps to the particular set of memory cells whose input is desired during each time slot, it is possible to significantly reduce the number of switches required to implement the sequence generator of this invention. The minimization procedure thus seeks to assign the memory cells 410 to the taps 412 in such an order as to minimize the number of different cells that must be connected to each tap at any time during sequence generation. A "tap exchange" method of optimizing a sequence generator design by interchanging cells between the taps can be illustrated by the following example.

In a preferred embodiment for generating a sequence based on the polynomial $x^7+x^6+x^5+x^4+1$, which may be implemented as shown in FIG. 3, a chart may be constructed showing the memory cells connected to each of the four taps 312 at each clock time. According to the parallel architecture scheme of this invention, each of the taps is to be connected to the next lower cell during each successive clock cycle. This is shown in the following table fragment:

|      | time |   |
|------|------|---|
| taps | 0    | 1 |
| A    | 4    | 3 |
| B    | 5    | 4 |
| C    | 6    | 5 |
| D    | 7    | 6 |

Thus at time t=0 the taps A, B, C and D are at their starting position, connected to memory cells 312 numbered "4", "5", "6", and "7", respectively. At time t=1, each tap moves to the next lower memory cell number as shown in the column for time=1, and the taps are then connected to memory cells 310 numbered "3", "4", "5", and "6", respectively. However, this column can be reordered so that the taps 312 are connected to memory cells 310 numbered "4", "5", "6", and "3", respectively, without modifying the result generated by the XOR tree. This is shown in the next table fragment.

|      | time |   |
|------|------|---|
| taps | 0    | 1 |
| A    | 4    | 4 |
| B    | 5    | 5 |
| C    | 6    | 6 |
| D    | 7    | 3 |

According to this arrangement, only tap D has to switch to another memory cell at the transition to time 1. Therefore, only one tap selector switch is required for this step. Similarly, a complete table may be produced and the "tap exchange" method employed to optimize the circuitry by interchanging cells within each column to minimize the number of tap selector switches required.

The "tap exchange" minimization procedure for a M-tap implementation of this invention may be performed by first constructing a table specifying the memory cells connected to each tap at each of N clock cycles, where N is the number of memory cells, and then modifying this table according to the following steps:

1) For the initial time (t=0), write the memory cell number to which each tap is connected. (In preferred embodiments, the initial tap assignments will correspond to the exponents in the polynomial being implemented.)

2) For each subsequent clock cycle, reduce the number of the memory cell connected to each tap by one, until the original pattern is repeated.

3) For each time frame after the initial one (t=0), rearrange the memory cells within each column so as to keep as many taps as possible connected to the same memory cell as in the immediately preceding time frame.

4) Further rearrange memory cells within each column so as to minimize the number of different memory cells that must be connected to each tap.

5) The process is terminated when any further change in the memory cell assignments either increases the number of memory cells connected to a tap or does not reduce the number of memory cells connected to a tap.

The table ultimately obtained describes the optimum connections between each memory cell and the taps of the XOR tree.

The "tap exchange" optimization procedure is illustrated for the polynomial shown implemented in FIG. 3 and FIG. 4, that is: $x^7+x^6+x^5+x^4+1$.

Table 1 is obtained by carrying out the first two steps:

TABLE 1

Assignment of the taps before minimization.

|      | time |   |   |   |   |   |   |   |
|------|------|---|---|---|---|---|---|---|
| taps | 0    | 1 | 2 | 3 | 4 | 5 | 6 | 0 |
| A    | 4    | 3 | 2 | 1 | 7 | 6 | 5 | 4 |
| B    | 5    | 4 | 3 | 2 | 1 | 7 | 6 | 5 |
| C    | 6    | 5 | 4 | 3 | 2 | 1 | 7 | 6 |
| D    | 7    | 6 | 5 | 4 | 3 | 2 | 1 | 7 |

To implement the connections shown in this table, before the "tap exchange" procedure is performed, each tap must be connected by a switch to each memory cell, as shown in FIG. 4A.

To minimize the number of tap selector switches required, the second and subsequent columns are reordered as indicated in steps 3 and 4 of the "tap exchange" procedure, keeping as many memory cells connected to the same taps as possible from one clock cycle to the next, thereby obtaining Table 2.

TABLE 2

Reordering the memory cells in each column to minimize the variety of cells in each row.

|      | time |   |   |   |   |   |   |   |
|------|------|---|---|---|---|---|---|---|
| taps | 0    | 1 | 2 | 3 | 4 | 5 | 6 | 0 |
| A    | 4    | 4 | 4 | 4 | 7 | 7 | 7 | 4 |
| B    | 5    | 5 | 5 | 1 | 1 | 6 | 5 | 5 |
| C    | 6    | 6 | 2 | 2 | 2 | 2 | 6 | 6 |
| D    | 7    | 3 | 3 | 3 | 3 | 1 | 1 | 7 |

From Table 2 it is apparent that the following switch assignments are required to implement this polynomial:

| 2 switches for tap A | (memory cells "4" and "7") |
| 3 switches for tap B | (memory cells "1", "5" and "6") |
| 2 switches for tap C | (memory cells "2" and "6") |
| 3 switches for tap D | (memory cells "1", "3" and "7") |

A total of 10 tap switches is needed to implement this polynomial. This is in contrast to 28 switches (N=7, M=4) which would be needed to connect every tap to every memory cell, as shown in FIG. 4A.

This result is not unique. Another reordering that requires the same number of switches is shown in Table 3.

TABLE 3

Another reordering requiring 10 switches.

| taps | \multicolumn{8}{c}{time} |
| --- | --- | --- | --- | --- | --- | --- | --- | --- |
|  | 0 | 1 | 2 | 3 | 4 | 5 | 6 | 0 |
| A | 4 | 4 | 4 | 4 | 1 | 2 | 1 | 4 |
| B | 5 | 5 | 5 | 1 | 3 | 1 | 5 | 5 |
| C | 6 | 6 | 2 | 2 | 2 | 6 | 6 | 6 |
| D | 7 | 3 | 3 | 3 | 7 | 7 | 7 | 7 |

Figure 5:
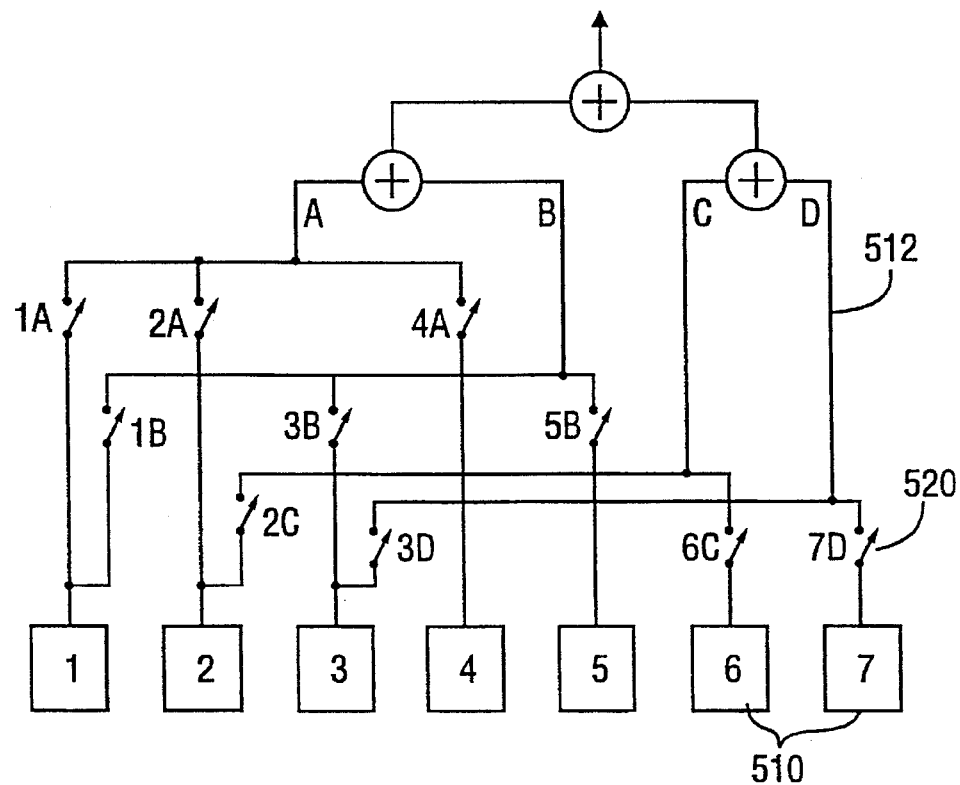
FIG. 5 is a block diagram of the parallel architecture of this invention, as shown in FIG. 4A, after minimization of the number of switches used.

A schematic diagram representing the tap switches required according to Table 3 is shown in FIG. 5, which shows the organization of the ten tap switches 520 connecting the seven memory cells 510 to the four taps 512. Thus, as indicated in Table 3, tap A is connected to memory cells 510 numbered "1", "2", and "4". Tap B is connected to memory cells 510 numbered "1", "3", and "5", and so on. Each tap switch 520 is labeled according to the tap and memory cell it connects. For example, switch "1A" connects memory cell "1" to tap A. Table 3 also provides the information required to implement a control unit which generates the timing signals for controlling all of the switches in the circuit (in preferred embodiments). One possible embodiment of the circuitry for such a control unit is shown in FIG. 6, which shows a collection of OR gates to which output controls switches 1A through 7D, which translate the time signals T0 to T6 from the N-phase generator into control signals that operate the individual tap switches.

Figure 6:
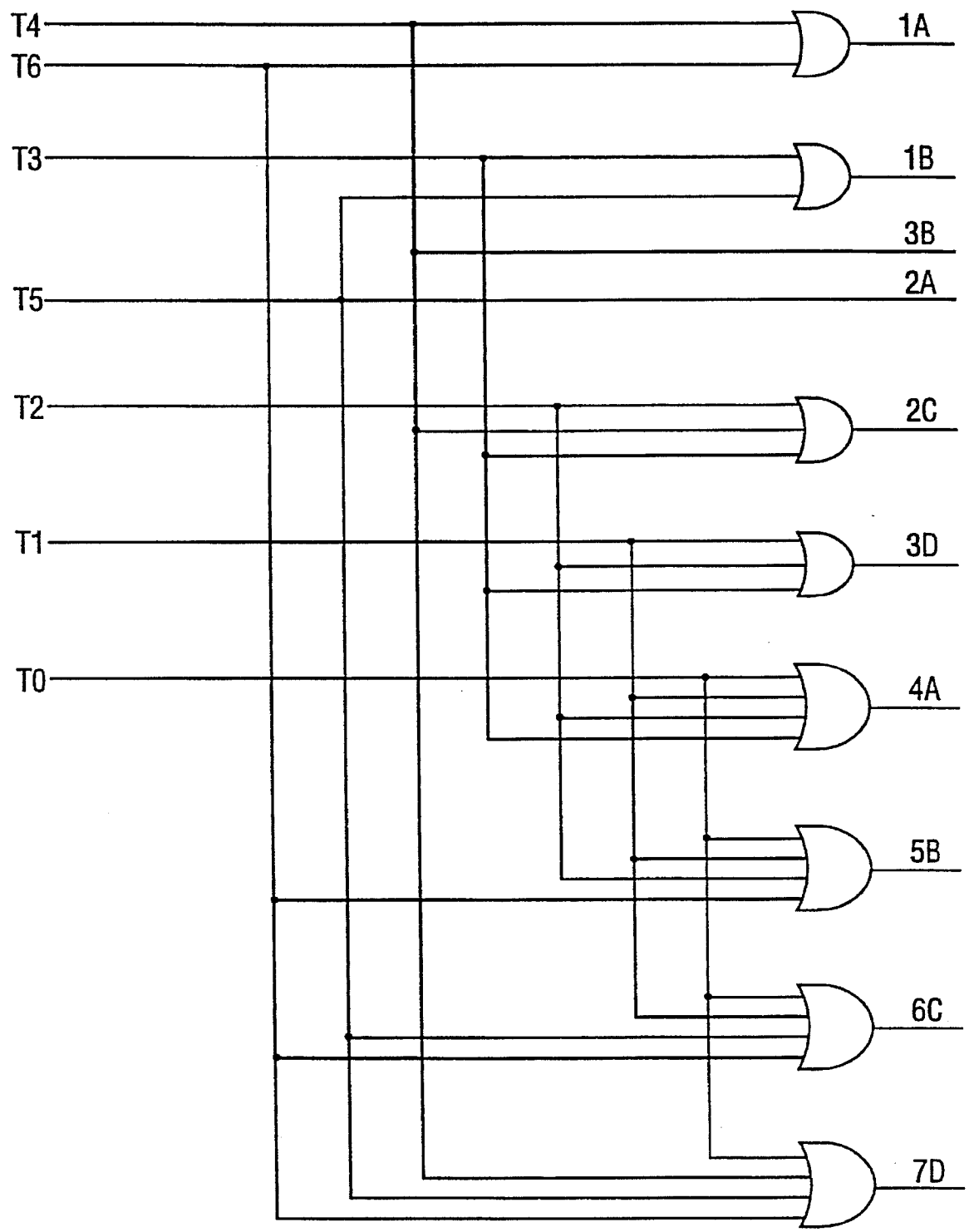
FIG. 6 is a schematic of a control unit that could be used to control the operation of the tap switches of a sequence generator as shown in FIG. 5.

In a preferred embodiment having, for example, seven memory cells, referring to FIG. 6, timing signals T0 through T6 are supplied by a 7-phase timing generator circuit, which has been described previously. During the first time period (t=0) a signal is received on control unit input line T0, which actuates switches connected to control unit output lines 4A, 5B, 6C, and 7D. During the second time period T1, switches 3D, 4A, B5, and 6C are closed. Similarly, during each of the seven time periods four of the switches are actuated by the logic circuitry of FIG. 6 as required by Table 3. Additional similar circuitry may be employed to generate a signal to close one of the feedback selector switches during each clock cycle in order to conduct the output to the desired memory cell for storage, as would be apparent to one skilled in the art. The control unit may, of course, be implemented using different circuitry than that shown in FIG. 6 in order to accomplish the same translation from timing signals to switch control signals. Many alternative methods for generating the required control signals will be apparent to one of skill in the art.

Figure 9:
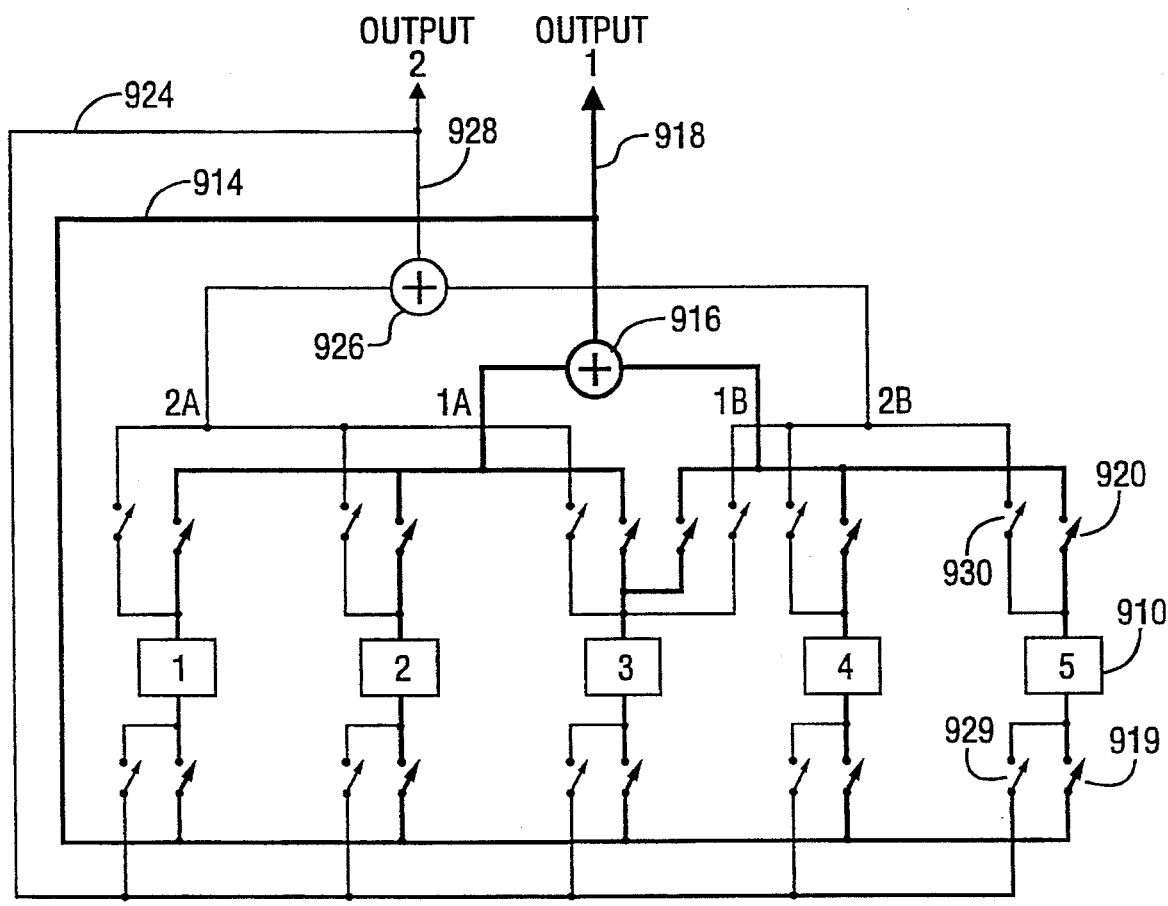
FIG. 9 is another block diagram of a five memory cell, two-tap implementation configured to generate two bits of the sequence in parallel during each clock cycle based on the polynomial $x^5+x^2+1$.

The parallel sequence generator architecture according to this invention may be adapted to provide more than one bit of sequence information per clock cycle. This is possible because the input information needed by the logic circuitry for several successive clock cycles may be simultaneously available. According to this invention, the bits stored in all but one of the memory cells do not change with each clock cycle, and thus they may be accessed for several calculations simultaneously. One possible organization to increase the throughput by generating more than one output bit at a time is shown in FIG. 9. This figure, shows a switch arrangement that may be employed to implement the polynomial $x^5+x^2+1$. FIG. 8 shows the implementation of this polynomial according to this invention with a single output. FIG. 9 shows the implementation with an additional logic tree connected in parallel for computing the next bit of information. Two bits of information are thereby generated for each clock cycle.

The advantage obtained using such a parallel architecture according to this invention is that the resulting increase in throughput per clock cycle can be traded for power reduction by reducing the clock frequency of the sequence generator unit. If a single bit serial output is desired, then circuitry (not shown) for converting the multi-bit output to a single bit, serial output may be designed to operate at higher frequency.

Figure 7:
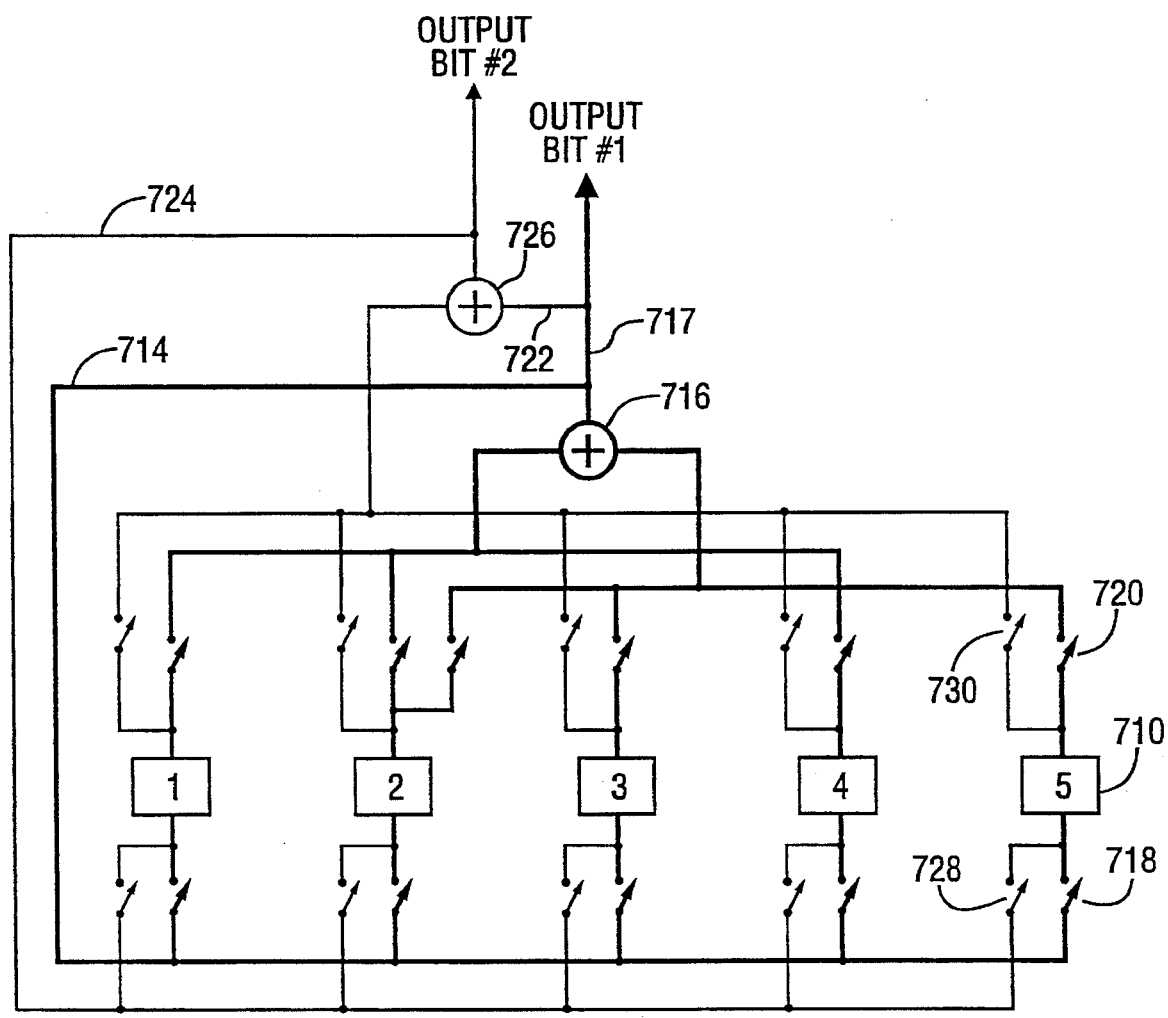
FIG. 7 is a block diagram of an implementation of the parallel architecture of this invention that provides, in parallel, two bits of the generated sequence per clock cycle based on the polynomial $x^5+x+1$.

When the polynomial is such that the bit presently being computed is needed for calculation of the succeeding bit in the sequence, the architecture may be slightly modified as shown in FIG. 7. FIG. 7 implements the polynomial $X^5+X+1$, providing two output bits in each clock cycle. The output 717 of the first logic circuit 716 is coupled directly to an input of logic circuitry 722 of the second logic circuit 726, as well as into the memory cells 710 where the result is to be stored via first feedback line 714. In FIG. 7, the output of the second logic circuit 726 is coupled to the input switches 728 via feedback line 724. First tap selector switches 720 and second tap selector switches 730 control the memory cells 710 which connect to first logic circuit 716 and second logic circuit 726, respectively.

To more particularly describe a preferred embodiment, FIG. 9 shows a switch configuration for implementing the $x^5+x^2+1$ polynomial and generating two bits of the sequence at a time. These two parallel bits may be multiplexed by methods known in the art to generate the sequence at twice the clock rate of the sequence generation circuitry. FIG. 10B is a chart that shows the contents of each memory cell in generating a sequence based on the $x^5+x^2+1$ polynomial. The result of cycle 0 (which is stored in memory cell number "5" in cycle 1) is not needed for a subsequent computation until cycle 2. Similarly, the result of cycle 1 is not needed until cycle 3. Therefore, the logic of cycle 0 and cycle 1 may be executed simultaneously, using the structure illustrated in FIG. 9, with the results being simultaneously directed to stages 5 and 4, respectively, by first feedback line 914 and second feedback line 924. On the next clock signal, cycle 2 and cycle 3 may be executed simultaneously, providing the next two bits of the sequence at the parallel outputs 918, 928. The results of cycles 2 and 3 are simultaneously fed back into memory cells 910 numbered "3" and "2", respectively In FIG. 9, outputs 918, 928 from logic circuits 916, 926 are coupled to input switches 919 and 929, respectively, via first feedback line 914 and second feedback line 924, respectively. First tap selector switches 920 and second tap selector switches 930 control the connection of memory cells 910 to first logic circuit 916 and second logic circuit 926, respectively.

The sequences corresponding to some polynomials may be generated with even more bits in parallel. For example, the polynomial $x^7+x^6+x^5+x^4+1$ requires four taps and the XOR logic as shown in the prior art conventional shift register implementation of FIG. 1. By implementing the tap switch structure according to this invention and shown in FIG. 5, the same sequence may be generated without a shift register, as discussed above. By repeating the switch structure of FIG. 4 four times in parallel and constructing an appropriate control unit, four bits of the sequence may be generated simultaneously. It may be seen in FIG. 11B that for such a structure the result of cycle 0, which is stored in memory cell "7", is not needed as an input until cycle 4. Thus, the first 4 cycles may be calculated simultaneously, the inputs to the XOR trees requiring only the initial bits stored in the memory cells. The results of cycles 1–4 may be provided to external circuitry and simultaneously stored in memory cells "7", "6", "5" and "4", respectively, which puts in place all of the information required to calculate the results of the next four cycles (4–7) in parallel on the next clock signal. For this particular polynomial, the output sequence can thus be provided at four times the clock speed of the sequence generator itself.

In order to further clarify the operation of a sequence generator according to the present invention, FIG. 10A, FIG. 10B, FIG. 11A and FIG. 11B will now be discussed in more detail. FIG. 10A illustrates the cell contents for the first 10 cycles in a prior art sequence generator constructed as a conventional linear feedback shift register implementing the polynomial $x^5+x^2+1$ (see FIG. 2). The taps are fixed at cells number "2" and "5", indicated by the letter "T" to the cell numbers in FIG. 10A. The cells are initially loaded with ones in the example presented in FIG. 10A although the initial contents of the cells can be any desired sequence. During cycle 0, when all of the cells contain ones, the output is zero (1 XOR 1=0). This output quantity is fed back to the input of cell number "1" so that at the beginning of cycle 1, the contents of cell number "1" becomes zero. The contents of cells numbered "1" through "4" shift downward by one cell in each cycle. As is shown in the column of FIG. 10A representing cycle 1, tapped cells numbered "2" and "5" still contain ones, and the output is again zero. FIG. 10A shows the cell contents and the output values for the first ten cycles.

FIG. 10B shows the memory cell content and output for the first ten cycles of a sequence generator constructed according to this invention, as is illustrated in FIG. 8. As was described above, during use of this invention the taps are connected to different memory cells during different clock cycles. In FIG. 10B, the memory cells to which the taps are connected in each cycle are indicated by a "T" in the block. In cycle 0, the taps are connected to memory cells numbered "2" and "5", resulting in an output of zero. During each cycle, the output is fed back into the memory cell indicated in the subsequent cycle by an "X". In this case, the output from cycle zero is fed back to memory cell number "5", into which it is latched at the beginning of cycle 1. During cycle 1, the taps are connected to memory cells numbered "1" and "4", resulting in an output of zero which is fed back to memory cell number "4" at the beginning of cycle 2, represented by the "X" in cell 4 in the column representing cycle 2. It is apparent that the same sequence is generated by the conventional implementation which is illustrated in FIG. 2 and FIG. 10A, and by the novel implementation according to this invention which is shown in FIG. 8 and FIG. 10B. FIG. 10B shows that in a sequence generator according to this invention, the contents of each memory cell remains the same until that memory cell is designated to receive the output, which is indicated by "X" in the appropriate cycle. It can be seen that the only time the content of a memory cell changes is when that memory cell is designated to receive the output of the logic circuitry as a feedback input. During the 10 cycles shown, using this invention, memory cells numbered "1", "3" and "4" only change state once, memory cell number "5" changes state twice, and memory cell number "2" does not change state at all. Referring to FIG. 10A, during the same 10 cycles the shift register cells of the prior art shift register implementation change state 23 times.

Similarly, FIG. 11A and FIG. 11B illustrate the content of the memory cells and the output generated by the logic circuitry for an implementation of the polynomial $x^7+x^6+x^5+x^4+1$, starting with a one in each memory cell. These illustrations show the first thirteen cycles. FIG. 11A shows that the taps are connected permanently to memory cells numbered "4", "5", "6" and "7". The output from each cycle is fed back to the memory cell number "1", into which it is latched at the beginning of the next cycle. At the beginning of each cycle, the contents of each memory cell moves down by one memory cell, and the content of the highest order memory cell, memory cell number "7" in this case, is lost.

FIG. 11B shows an implementation of the same polynomial in a circuit according to this invention, such as that shown in FIG. 5 (or FIG. 4 before optimization). The taps are connected to memory cells numbered "4", "5", "6" and "7" in cycle 0 (indicated by "T"), generating an output of zero which is fed to memory cell "7", into which it is latched at the beginning of cycle 1. During cycle 1 the taps are connected to memory cells numbered "3", "4", "5" and "6", again resulting in an output of zero, which is fed back to memory cell number "6", into which it is latched at the beginning of cycle 3.

The function of a shift register can also be generically implemented using the parallel architecture of this invention. Referring to FIG. 12B, a "parallel shift register" can be constructed using N independent memory cells 1210, each memory cell having an associated tap selector switch 1220 and an input switch 1218. The tap selector switches 1220 are connected to the output 1212 of the parallel shift register and the input switches 1218 are used to selectively connect each memory cell 1210 to the input 1214 of the parallel shift register. The tap selector switches 1220 and the input switches 1218 are controlled by timing signals 1242 generated by timing signal generator 1240 in FIG. 12A. Various ways of implementing timing signal generator 1240 to generate timing signals 1242 are well known to those of skill in the art. Bits are read out of this parallel shift register by closing the tap selector switches 1220 under the control of timing signals 1242, resulting in an output identical to that generated by a conventional shift register. During each cycle the input bit may be stored in the memory cell that was read in the prior cycle by sequentially closing the input switches 1218, thus producing a proper delay of N clock cycles before an input bit appears at the output. This implementation of a shift register is similar to the sequence generator implementation discussed above, with the input provided to the memory cells from an external source rather than from the output of the sequence generator logic circuit. A parallel shift register according to this invention can be used in place of a conventional shift register in substantially any application, providing the economies of power consumption that have been described in connection with the sequence generator implementation.

To better understand the operation of a parallel shift register according to this invention, the operation of the implementation shown in FIG. 12A will be described. During cycle T=1, the input and output (tap) switches labeled "T1" are closed, permitting an input into memory cell number "1" and an output from memory cell number "N", the last memory cell in the parallel shift register. During cycle T=2, switches labeled "T2" are closed, permitting input into memory cell number "N", which was read in cycle T=1, and permitting memory cell "N-1" to be read. During each subsequent cycle, the switches to be closed are shifted by one memory cell to the left. The information that was placed in memory cell 1 at T=1 will not be read until T=N, thereby allowing the desired delay time to be chosen by selection of N, which represents the number of memory cells.

Figure 12A:
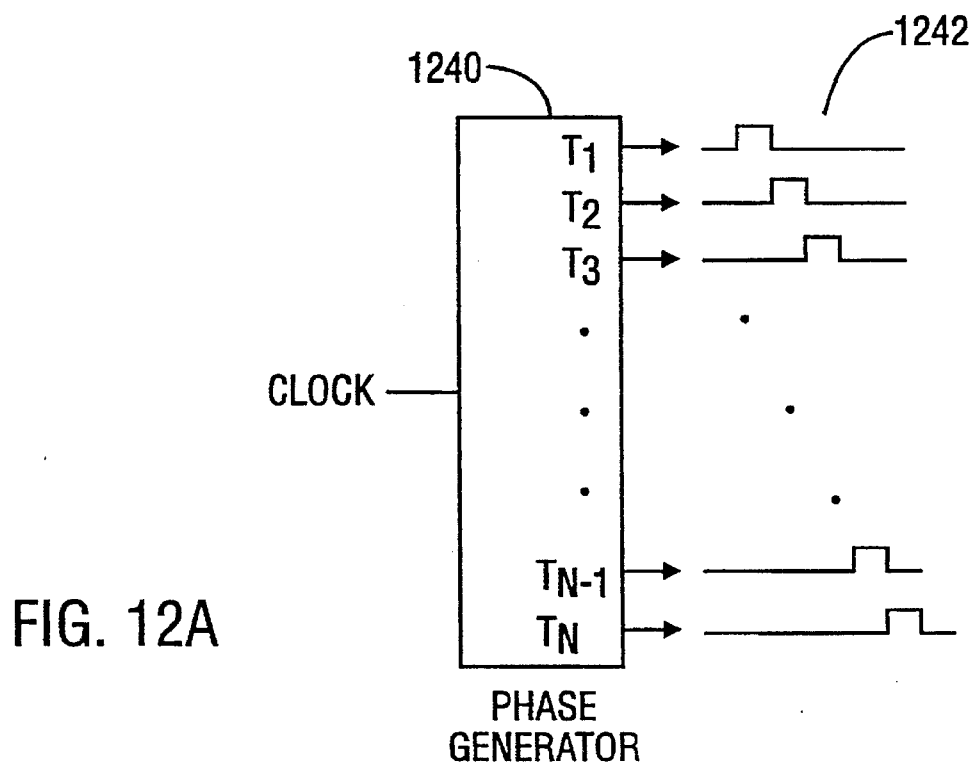
FIG. 12A is a diagram showing a phase generator used in FIG. 12B.
Figure 12B:
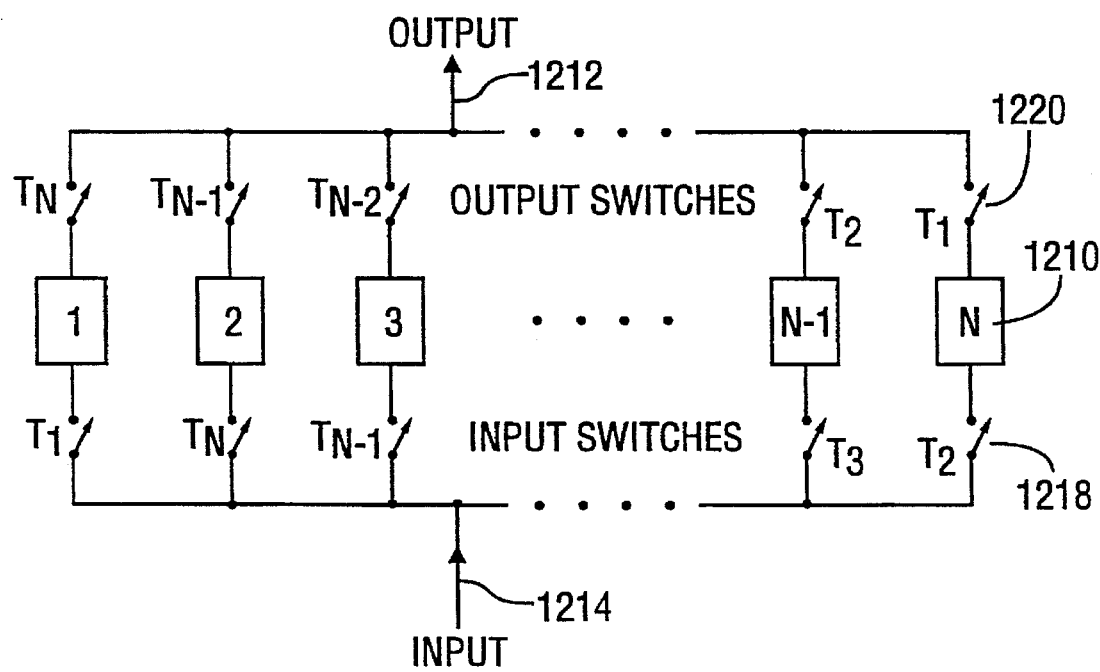
FIG. 12B is a block diagram of a parallel shift register of the parallel architecture of this invention.

When the function of a shift register is implemented according to this invention, for example as shown in FIG. 12A, the state of any desired memory cell may be read by a properly positioned tap switch and fed into selected logic circuitry to perform a desired function.

A parallel shift register according to this invention may be used in a cyclic code decoder or in any desired feedback or non-feedback shift register configuration.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size, and arrangement of parts. For example, equivalent elements or materials may be substituted for those illustrated and described herein, and certain features of the invention may be utilized independently of the use of other features, all as would be apparent to one skilled in the art after having the benefit of this description of the invention. In particular, all or part of this invention may be implemented by a digital computer, such as a microprocessor, as well as by dedicated hardware.

What is claimed is:

1. A digital sequence generator, comprising:

a plurality of memory cells, each memory cell storing a bit of information in a digital format;

logic circuitry having a plurality of inputs connectable to selected memory cells, for generating an output based upon the contents of said memory cells;

tap switches, each of said tap switches for selectively connecting one of said memory cells to an input of said logic circuitry;

feedback circuitry for coupling the output of the logic circuitry to an input of a selected memory cell.

2. The sequence generator of claim 1, wherein said feedback circuitry comprises a plurality of feedback switches, each feedback switch being operable to connect the output of the logic circuitry to one of said memory cells.

3. The sequence generator of claim 1, wherein said memory cells are not operable to pass digital information directly from one memory cell to another memory cell.

4. The sequence generator of claim 1, further comprising a control unit coupled to said tap switches for controlling operation of said tap switches.

5. The sequence generator of claim 1, wherein said logic circuitry adds modulo 2 the information stored in the memory cells that are coupled to the logic circuitry by the tap switches.

6. A method of generating digital sequences, comprising:

providing a plurality of memory cells, logic circuitry for generating an output based upon contents of selected memory cells, tap switches operable to connect selected memory cells to inputs of the logic circuitry, and feedback circuitry;

closing selected tap switches to connect selected memory cells to input of the logic circuitry;

calculating an output using said logic circuitry, said output being dependent upon the contents of the memory cells connected to said inputs of the logic circuitry, said output becoming one bit in the digital sequence being generated;

storing said output in a selected one of said memory cells using said feedback circuitry.

7. The method of claim 6, further comprising generating subsequent bits in the digital sequence by repeating said closing, calculating and storing steps for each bit to be generated.

8. The method of claim 7, wherein said calculating step comprises adding modulo 2 the contents of said selected memory cells.

9. The method of claim 7, further comprising changing the selected tap switches each time the closing step is performed.

10. A digital sequence generator for generating two or more bits of a digital sequence simultaneously, comprising:

a plurality of memory cells, each memory cell storing a bit of information in a digital format;

two or more logic circuitries, each logic circuitry having a plurality of inputs connectable to selected memory cells, each logic circuitry for generating an output based on the information stored in said memory cells;

two or more tap switches, each tap switch for selectively connecting one of said memory cells to an input of a selected one of said logic circuitry;

feedback circuitry for selectively coupling the outputs of the logic circuitries to inputs of a selected ones of said memory cells.

11. The sequence generator of claim 10, wherein an output of one of the logic circuitries is an input to another of the logic circuitries.

* * * * *